United States Patent
Chang

(10) Patent No.: US 9,257,496 B2
(45) Date of Patent: Feb. 9, 2016

(54) METHOD OF FABRICATING CAPACITOR STRUCTURE

(71) Applicant: UNITED MICROELECTRONICS CORPORATION, Hsinchu (TW)

(72) Inventor: Pao-Chu Chang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 264 days.

(21) Appl. No.: 13/742,359

(22) Filed: Jan. 16, 2013

(65) Prior Publication Data

US 2014/0199819 A1 Jul. 17, 2014

(51) Int. Cl.
*H01L 49/02* (2006.01)
*H01L 21/311* (2006.01)
*H01L 23/522* (2006.01)

(52) U.S. Cl.
CPC .............. *H01L 28/40* (2013.01); *H01L 21/311* (2013.01); *H01L 21/31144* (2013.01); *H01L 23/5223* (2013.01); *H01L 28/60* (2013.01); *H01L 28/75* (2013.01)

(58) Field of Classification Search
CPC . H01L 21/311; H01L 21/31144; H01L 28/40; H01L 28/60; H01L 28/75; H01L 23/5223
See application file for complete search history.

(56) References Cited

U.S. PATENT DOCUMENTS

| 6,319,767 | B1 * | 11/2001 | Cha et al. | 438/250 |
|---|---|---|---|---|
| 6,908,826 | B2 * | 6/2005 | Kim | 438/393 |
| 8,207,568 | B2 * | 6/2012 | Chinthakindi et al. | 257/306 |
| 2003/0011043 | A1 * | 1/2003 | Roberts | 257/532 |
| 2005/0026356 | A1 * | 2/2005 | Kim | 438/238 |
| 2006/0183280 | A1 * | 8/2006 | Lee et al. | 438/239 |
| 2009/0316332 | A1 * | 12/2009 | Okubo et al. | 361/311 |
| 2010/0155889 | A1 * | 6/2010 | Cho et al. | 257/532 |
| 2010/0301451 | A1 * | 12/2010 | Iwaki | 257/532 |
| 2011/0108951 | A1 * | 5/2011 | Cho et al. | 257/532 |
| 2012/0187536 | A1 * | 7/2012 | Dunn et al. | 257/532 |
| 2012/0190164 | A1 * | 7/2012 | Coolbaugh et al. | 438/381 |
| 2012/0244674 | A1 * | 9/2012 | Kim et al. | 438/299 |
| 2014/0035099 | A1 * | 2/2014 | Lehr | 257/532 |
| 2014/0159198 | A1 * | 6/2014 | Ren et al. | 257/532 |

* cited by examiner

Primary Examiner — Savitr Mulpuri
(74) Attorney, Agent, or Firm — Ding Yu Tan

(57) ABSTRACT

A method of fabricating a capacitor structure includes the following steps. Firstly, a substrate is provided. A first conductive layer, a first insulation layer, a second conductive layer and a second insulation layer are sequentially formed over the substrate. A hard mask material layer is formed on the second insulation layer. Then, the hard mask material layer is defined with a photo resist pattern, so that a hard mask is formed. After the photo resist pattern is removed, the second conductive layer is defined with the hard mask, so that a first electrode of the capacitor structure is formed.

7 Claims, 3 Drawing Sheets

METHOD OF FABRICATING CAPACITOR STRUCTURE

FIELD OF THE INVENTION

The present invention relates to a method of fabricating a semiconductor structure, and more particularly to a method of fabricating a capacitor structure.

BACKGROUND OF THE INVENTION

Nowadays, the trends of designing integrated circuits are developed toward miniaturization. As the integration density of the electronic components is increased, the performance of the integrated circuit is enhanced. For example, a metal-insulator-metal (MIM) capacitor and various electronic components are widely used in the high-density integrated circuit. However, during the process of fabricating the small-sized MIM capacitor, the MIM capacitor is readily polluted by contaminants. Under this circumstance, the performance of the MIM capacitor is deteriorated even to the point of breakdown of the MIM capacitor.

Therefore, there is a need of providing an improved MIM capacitor to eliminate the above drawbacks.

SUMMARY OF THE INVENTION

In accordance with an aspect, the present invention provides a method of fabricating a capacitor structure. Firstly, a substrate is provided. A first conductive layer, a first insulation layer, a second conductive layer and a second insulation layer are sequentially formed over the substrate. A hard mask material layer is formed on the second insulation layer. Then, the hard mask material layer is defined with a photo resist pattern, so that a hard mask is formed. After the photo resist pattern is removed, the second conductive layer is defined with the hard mask, so that a first electrode of the capacitor structure is formed.

In particular, a hard mask is formed by defining a hard mask material layer with a photo resist pattern. After the photo resist pattern is removed, a first electrode is formed defining a second conductive layer with the hard mask. Consequently, the contaminants caused by the retained photoresist material is minimized or eliminated, and the performance of the MIM capacitor structure is enhanced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
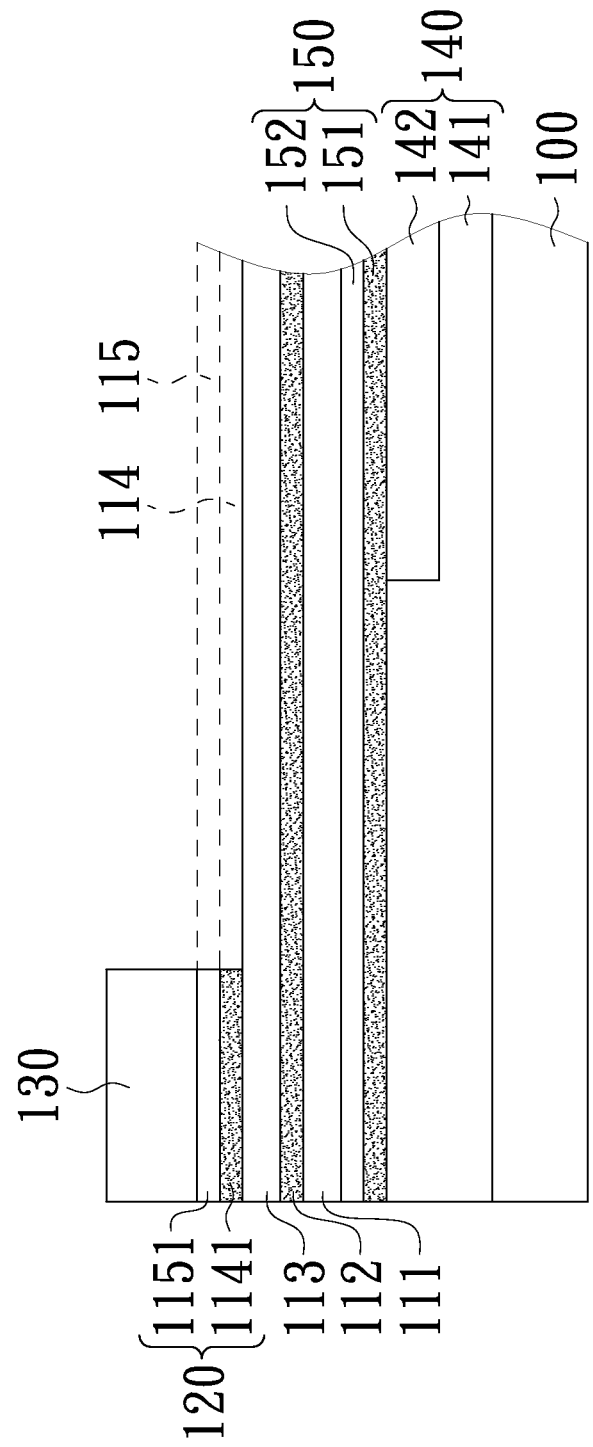
FIGS. 1A~1C are schematic cross-sectional views illustrating a method of fabricating a capacitor structure according to an embodiment of the present invention.
Figure 1B:
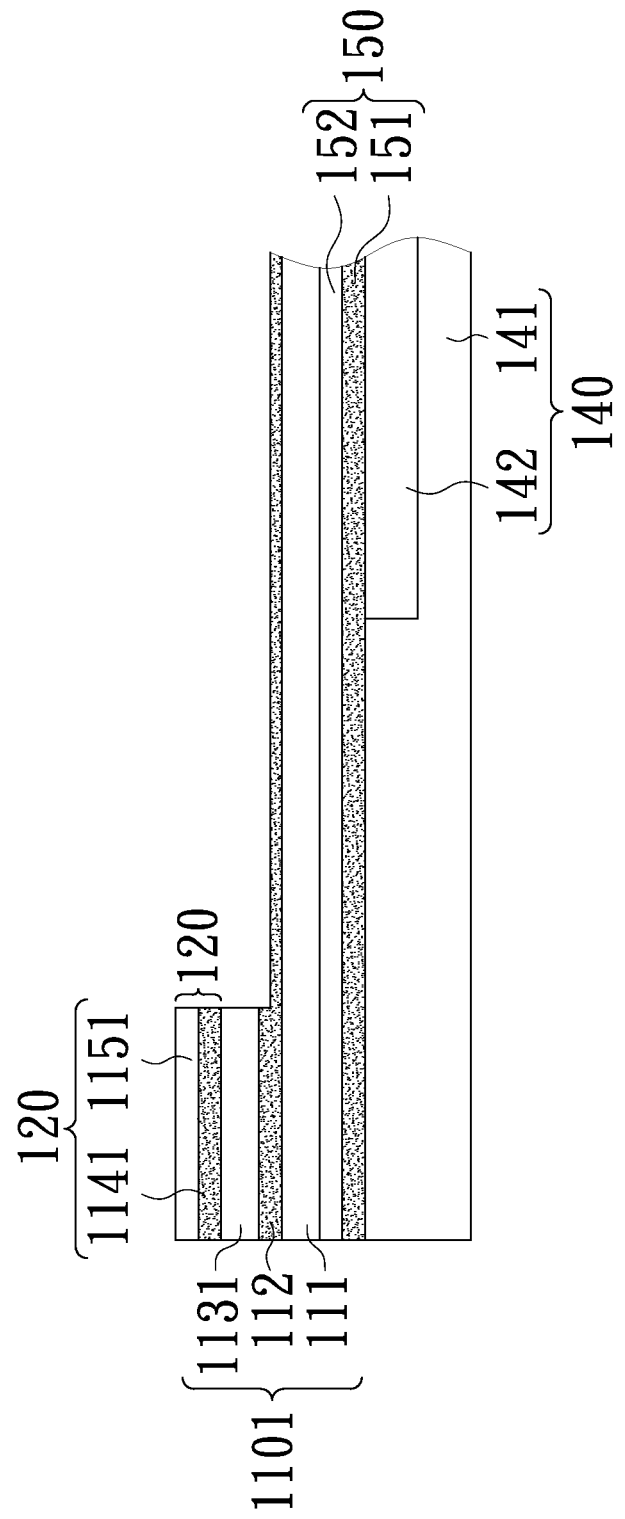
Figure 1C:
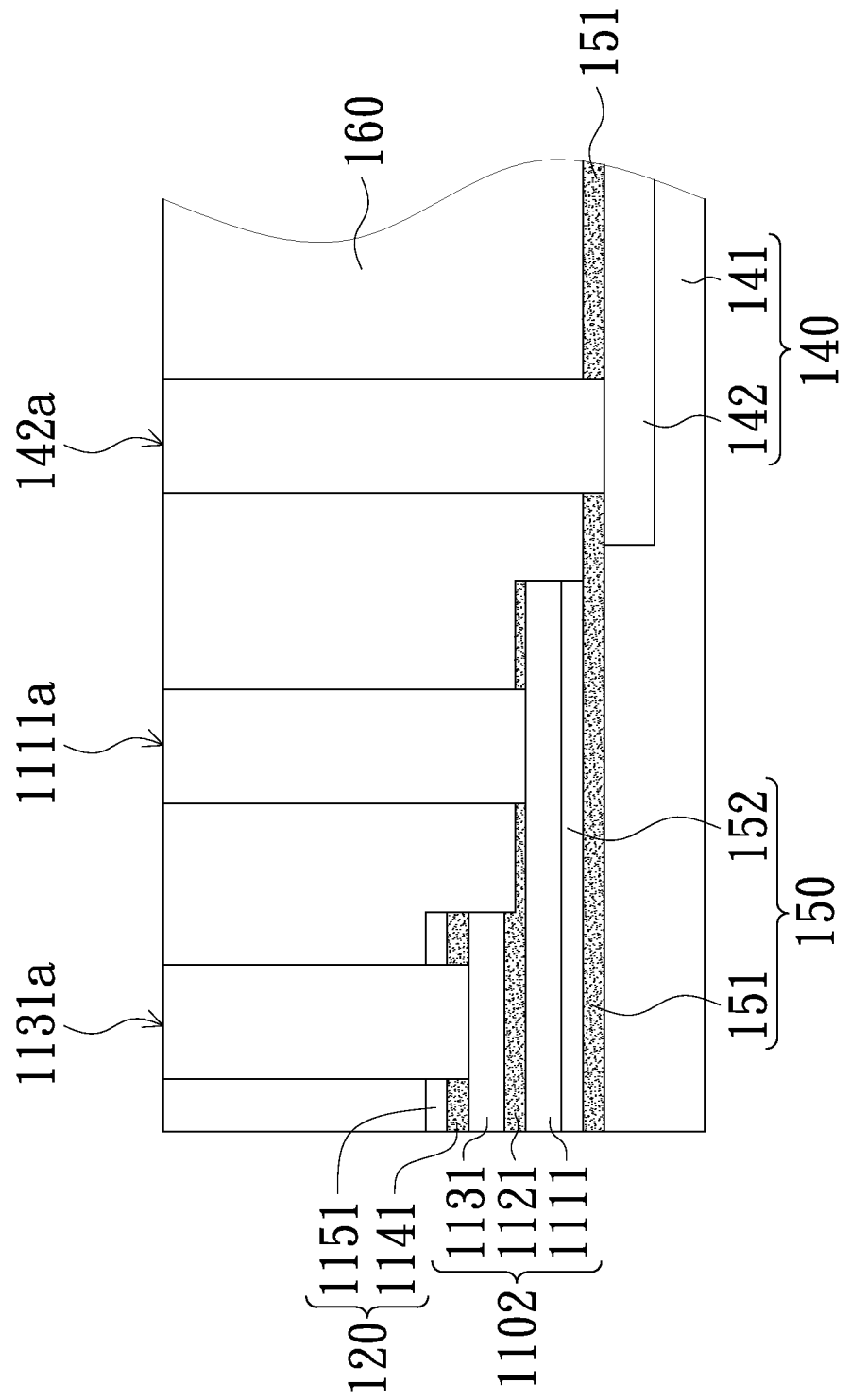

FIGS. 1A~1C are schematic cross-sectional views illustrating a method of fabricating a capacitor structure according to an embodiment of the present invention.

Firstly, as shown in FIG. 1A, a first conductive layer 111, a first insulation layer 112, a second conductive layer 113 and a second insulation layer 114 are sequentially formed over a substrate 100. Then, a hard mask material layer 115 is formed on the second insulation layer 114. Then, a photolithography process is performed to form a photo resist pattern 130 on the hard mask material layer 115. After a portion of the hard mask material layer 115 uncovered by the photo resist pattern 130 is removed, a hard mask is produced. However, in this embodiment as shown in FIG. 1A, the second conductive layer 113 is used as a stop layer. After a portion of the hard mask material layer 115 and a portion of the second insulation layer 114 uncovered by the photo resist pattern 130 are sequentially removed, a hard mask 120 is produced. In other words, a remaining hard mask material layer 1151 and a remaining second insulation layer 1141 are collaboratively constructed as the hard mask 120. The material or the conductivity type of the substrate 100 and the materials of the first conductive layer 111, the first insulation layer 112, the second conductive layer 113 and the second insulation layer 114 may be varied according to the practical requirements. In a case that the hard mask material layer 115 and the second insulation layer 114 are made of different materials, the hard mask material layer 115 and the second insulation layer 114 have etching selectivity with respect to the same etching recipe.

In the MIM capacitor structure of this embodiment, the first conductive layer 111 and/or the second conductive layer 113 is made of titanium nitride (TiN), the first insulation layer 112 and the second insulation layer 114 are made of silicon nitride, and the hard mask material layer 115 is made of silicon oxide. Optionally, before the first insulation layer 112 is formed over the substrate 100, an interconnection structure 140 and an insulation structure 150 are formed between the substrate 100 and the first conductive layer 111. For example, various functional circuits (not shown) may be previously formed on the surface of the substrate 100, and then the wiring structure of the functional circuits is formed on the surface of the substrate 100. For example, the interconnection structure 140 comprises a wiring insulation layer 141 and a third conductive layer 142, which are produced by a damascene process. After the interconnection structure 140 is formed, a third insulation layer 151 and a fourth insulation layer 152 of the insulation structure 150 are sequentially formed over the interconnection structure 140. In an embodiment, the third insulation layer 151 is made of the same material as the first insulation layer 112 (e.g. silicon nitride), and the fourth insulation layer 152 is made of the same material as the hard mask material layer 115 (e.g. silicon oxide).

As known, the organic material that is used as the photoresist usually contains long-chain organic molecules with active functional groups. If the photo resist pattern is used as the etch mask, portions of the long-chain organic molecules of the photo resist pattern are decomposed by the etchant during the etching process. By analyzing the electrical defects of the functional circuits, it is found that the decomposed portions of the long-chain organic molecules are readily combined with various materials to result in contaminants. Especially, if the contaminants are organic metal complexes from the reaction of metal atoms and the long-chain organic molecules, it is very difficult to remove the organic metal complexes because of the high stability of the molecular structures thereof. Moreover, since the metal atoms are electrically conductive, if the organic metal complexes are retained on the insulation layer of the functional circuit (e.g. on the sidewall of the dielectric structure of the MIM capacitor structure), the functional circuit can possibly suffer from a short-circuiting problem and even has a breakdown. Based on the above analysis results, the present invention utilizes the hard mask as the etch mask to remove the conductive layer. Consequently, the contaminants caused by the retained photoresist material will be minimized or eliminated.

Next, please refer to FIG. 1B. The photo resist pattern 130 is removed. Then, by using the hard mask 120 as an etch mask and using the first insulation layer 112 as a stop layer, an etching process is performed to remove a portion of the second conductive layer 113 uncovered by the hard mask 120. Consequently, a first electrode 1131 of the MIM capacitor structure is produced from the remaining portion of the second conductive layer. Moreover, in order to reduce the number of the equipment-transferring steps, after a portion of the hard mask material layer 115 and a portion of the second insulation layer 114 uncovered by the photo resist pattern 130 are sequentially removed, the photo resist pattern 130 may be in-situ removed in the same etching chamber. Meanwhile, the first electrode 1131, the first insulation layer 112 and the first conductive layer 111 are collaboratively constructed as a MIM capacitor structure 1101.

Next, please refer to FIG. 1A-1C. The MIM capacitor structure 1101 of FIG. 1B is disposed over the interconnection structure 140 and the insulation structure 150. Then, it is necessary to integrate the MIM capacitor structure with the interconnection structure of the functional circuit. After another mask (not shown) is formed on the MIM capacitor structure 1101, a portion of the first insulation layer 112, a portion of the first conductive layer 111 and a portion of the fourth insulation layer 152 are removed, and thus a dielectric structure 1121 and a second electrode 1111 are formed. The first electrode 1131, the dielectric structure 1121 and the second electrode 1111 are collaboratively constructed as a MIM capacitor structure 1102. Then, a fifth insulation layer 160 is formed on the MIM capacitor structure 1102 and the interconnection structure 140. The fifth insulation layer 160 is made of the same material as the hard mask material layer 115 (e.g. silicon oxide). Then, a plurality of contact plugs 1131a, 1111a and 142a are formed over the first electrode 1131, the second electrode 1111 and the third conductive layer 142, respectively. Consequently, the MIM capacitor structure 1102 can be integrated with the interconnection structure 140 of the functional circuit.

Please refer to FIG. 1C again. For forming the contact plugs 1131a, 1111a and 142a, three openings (not shown) should be previously formed over the first electrode 1131, the second electrode 1111 and the third conductive layer 142, respectively. A process of forming these openings includes the following steps. Firstly, a portion of the remaining hard mask material layer 1151 and a portion of the fifth insulation layer 160 are removed. Then, a portion of the second insulation layer 114, a portion of the dielectric structure 1121, and a portion of the third insulation layer 151 are removed.

Since the remaining hard mask material layer 1151 and the fifth insulation layer 160 are made of the same material (e.g. silicon oxide), the portion of the remaining hard mask material layer 1151 and the portion of the fifth insulation layer 160 can be simultaneously removed. Moreover, as mentioned above, the first insulation layer 112, the second insulation layer 114 and the third insulation layer 151 are made of the same material (e.g. silicon nitride), and the etching rates of the hard mask material layer 115 and the second insulation layer 114 are different. During the process of removing the portion of the remaining hard mask material layer 1151 and the portion of the fifth insulation layer 160, the remaining second insulation layer 1141, the dielectric structure 1121 and the third insulation layer 151 are used as the stop layers. Consequently, the dielectric structure 1121 of the MIM capacitor structure 1102 is not over-etched. Then, the portions of the second insulation layer 1141, of the dielectric structure 1121 and of the third insulation layer 151 are simultaneously removed, respectively, so that the openings are created. After a conductive material is filled into the openings, the contact plugs 1131a, 1111a and 142a are formed.

From the above descriptions, the present invention provides a method of fabricating a capacitor structure. In accordance with the present invention, a hard mask is formed by defining a hard mask material layer with a photo resist pattern. After the photo resist pattern is removed, a first electrode is formed by defining a second conductive layer with the hard mask. Consequently, the contaminants caused by the retained photoresist material will be minimized or eliminated. Moreover, since the materials of the hard mask material layer and the dielectric structure of the MIM capacitor structure have etch selectivity, the possibility of over-etching the MIM capacitor structure 1102 will be minimized. Consequently, the number of the etching process steps is reduced, and the performance of the capacitor structure is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating a capacitor structure, the method comprising steps of:
   providing a substrate;
   sequentially forming a first conductive layer, a first insulation layer, a second conductive layer and a second insulation layer over the substrate;
   forming a hard mask material layer on the second insulation layer, wherein the second insulation layer and the hard mask material layer have etching selectivity;
   patterning the hard mask material layer and the second insulation layer with a photo resist pattern, thereby forming a patterned hard mask layer and a patterned second insulation layer both having aligned edge sidewalls;
   removing the photo resist pattern; and
   defining the second conductive layer with the patterned hard mask layer and the patterned second insulation layer, thereby forming a first electrode of the capacitor structure, wherein in the step of defining the second conductive layer with the patterned hard mask layer and the patterned second insulation layer, the first insulation layer is used as a stop layer, and further comprising a step of removing a portion of the first insulation layer and a portion of the first conductive layer, thereby forming a dielectric structure and a second electrode.

2. The method according to claim 1, wherein the first insulation layer and the second insulation layer are made of the same material.

3. The method according to claim 1, wherein in the step of forming the patterned hard mask layer, the second conductive layer is used as a stop layer, wherein after a portion of the hard mask material layer and a portion of the second insulation layer uncovered by the photo resist pattern are sequentially removed, the photo resist pattern is in-situ removed.

4. The method according to claim 1, wherein before the first insulation layer is formed, the method further comprises a step of forming an interconnection structure and an insulation structure over the substrate.

5. The method according to claim 4, wherein the step of forming the interconnection structure comprises sub-steps of:
   forming a wiring insulation layer over the substrate; and
   forming a third conductive layer within the wiring insulation layer.

6. The method according to claim 5, wherein the step of forming the insulation structure comprises sub-steps of:
   forming a third insulation layer on the interconnection structure; and
   forming a fourth insulation layer on the third insulation layer, wherein the third insulation layer and the fourth insulation layer are constructed as the insulation structure.

7. The method according to claim 6, wherein the third insulation layer is made of the same material as the first insulation layer.

* * * * *